(12) United States Patent
Katou

(10) Patent No.: US 11,085,948 B2
(45) Date of Patent: Aug. 10, 2021

(54) ELECTRIC CONNECTION DEVICE

(71) Applicant: Kabushiki Kaisha Nihon Micronics, Tokyo (JP)

(72) Inventor: Shinji Katou, Oita (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 70 days.

(21) Appl. No.: 16/495,263

(22) PCT Filed: Jan. 22, 2018

(86) PCT No.: PCT/JP2018/001723
§ 371 (c)(1),
(2) Date: Sep. 18, 2019

(87) PCT Pub. No.: WO2018/173448
PCT Pub. Date: Sep. 27, 2018

(65) Prior Publication Data
US 2020/0011897 A1 Jan. 9, 2020

(30) Foreign Application Priority Data
Mar. 24, 2017 (JP) .............................. JP2017-058503

(51) Int. Cl.
*G01R 1/04* (2006.01)
*G01R 1/067* (2006.01)
*G01R 1/073* (2006.01)
*G01R 31/00* (2006.01)
*G01R 31/26* (2020.01)
*G01R 31/28* (2006.01)

(52) U.S. Cl.
CPC ......... *G01R 1/073* (2013.01); *G01R 31/2886* (2013.01)

(58) Field of Classification Search
CPC .......... G01R 1/04; G01R 1/067; G01R 1/073; G01R 31/00; G01R 31/26; G01R 31/28
See application file for complete search history.

(56) References Cited

U.S. PATENT DOCUMENTS

| | | |
|---|---|---|
| 2009/0167335 A1 | 7/2009 | Yamada et al. |
| 2010/0134128 A1 | 6/2010 | Hobbs |
| 2012/0319711 A1* | 12/2012 | Hung ................. G01R 1/07371 324/750.16 |
| 2013/0161376 A1 | 6/2013 | Saito et al. |
| 2017/0038412 A1 | 2/2017 | Nagata et al. |

FOREIGN PATENT DOCUMENTS

| | | |
|---|---|---|
| JP | H1130647 A | 2/1999 |
| JP | 2002107411 A | 4/2002 |
| JP | 2007178405 A | 7/2007 |
| JP | 2009027373 A | 2/2009 |

(Continued)

*Primary Examiner* — Neel D Shah
(74) *Attorney, Agent, or Firm* — Lorenz & Kopf, LLP

(57) ABSTRACT

An electric connection device includes: a probe (11); a probe head (12) that holds the probe (11); and an electrode substrate (13) on which an electrode pad (131) to be connected to a proximal end of the probe (11) is provided. The probe head (12) is provided with a guide pin (14) for alignment of the probe head (12) and the electrode substrate (13), and the electrode substrate (13) is provided with a guide hole group composed of a plurality of guide holes corresponding to the guide pin (14).

4 Claims, 4 Drawing Sheets

(56) References Cited

FOREIGN PATENT DOCUMENTS

| | | | |
|---|---|---|---|
| JP | 2013130459 | A | 7/2013 |
| JP | 2015200621 | A | 11/2015 |
| JP | 2017096788 | A | 6/2017 |
| TW | 201137357 | A | 11/2011 |
| TW | 201344212 | A | 11/2013 |

\* cited by examiner

ELECTRIC CONNECTION DEVICE

TECHNICAL FIELD

The present invention relates to an electric connection device used to measure electric properties of an inspection object.

BACKGROUND ART

Measurement of electric properties of an inspection object, such as an integrated circuit, as a substrate is performed by using an electric connection device including a probe to be brought into contact with the object. In the configuration of some electric connection devices, a probe head that holds probes is attached to an electrode substrate on which electrode pads electrically connected to the probes are provided.

In the case of attaching the probe head to the electrode substrate, it is necessary to precisely align the probes with the electrode pads for contact. In an example of the method therefor, the probes and electrode pads are aligned by inserting a guide pin provided for the probe head into a guide hole provided for the electrode substrate.

CITATION LIST

Patent Literature

PTL 1—Japanese Patent Laid-open Publication No. 11-030647

SUMMARY OF INVENTION

Technical Problem

However, the positions of the guide pin and electrode pad are sometimes different from design positions thereof due to manufacturing errors of the probe head and electrode substrate. In such a case, even if the guide pin is inserted into the guide hole, the probe and electrode pad cannot be aligned precisely. This causes an insufficient contact between the probe and electrode pad, leading to problems including imprecise electric measurement of an inspection object.

In the light of the aforementioned problem, an object of the present invention is to provide an electric connection device in which the probe held by the probe head and the electrode pad provided for the electrode substrate are aligned precisely.

Solution to Problem

According to an aspect of the present invention, provided is an electric connection device, which includes: a probe; a probe head that holds the probe; and an electrode substrate on which an electrode pad to be connected to a proximal end of the probe is provided. The probe head is provided with a guide pin for alignment of the probe head and the electrode substrate, and the electrode substrate is provided with a guide hole group composed of a plurality of guide holes corresponding to the guide pin.

Advantageous Effects of Invention

According to the present invention, it is possible to provide an electric connection device in which the probe held by the probe head and the electrode pad provided for the electrode substrate are aligned precisely.

DESCRIPTION OF EMBODIMENT

Figure 1:
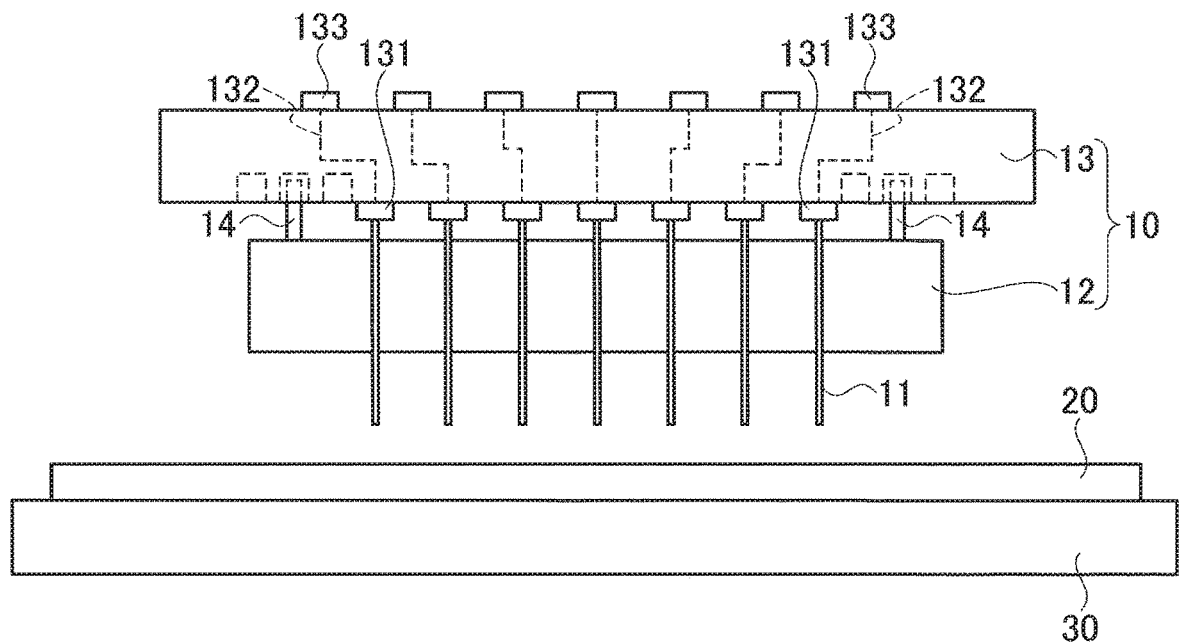
FIG. 1 is a schematic view illustrating the configuration of an electric connection device according to an embodiment of the present invention.

Next, an embodiment of the present invention is described with reference to the drawings. In the following description of the drawings, the same or similar portions are given the same or similar reference numerals. The drawings are schematic, and it should be noted that thickness proportions and the like are different from real ones. It is also obvious that dimensional relationship or proportions of some portions are different from each other throughout the drawings. The embodiment below illustrates a device and a method to embody the technical idea of the present invention. The embodiment of the present invention does not specify the material, shape, structure, arrangement, and the like of the constituent components to the following ones.

As illustrated in FIG. 1, an electric connection device 10 according to an embodiment of the present invention includes: a probe head 12, which holds probes 11; and an electrode substrate 13, on which electrode pads 131 are provided. FIG. 1 illustrates the probes 11 through the side surface of the probe head 12.

The probe head 12 is laid on and attached to the electrode substrate 13, and proximal ends of the probes 11 are electrically connected to the respective electrode pads 131. As illustrated in FIG. 1, the proximal ends of the probes 11 protruding from the upper surface of the probe head 12, that faces the electrode substrate 13, are connected to the respective electrode pads 131, which are provided on the lower surface of the electrode substrate 13, that faces the probe head 12.

The electric connection device 10 illustrated in FIG. 1 is a vertically-moving probe card, and the distal ends of the probes 11 exposed from the lower surface of the probe head 12 are brought into contact with inspection pads (not illustrated) of an inspection object 20 that is placed under the electric connection device 10. In the state illustrated in FIG. 1, the probes 11 are not in contact with the inspection object 20. When a chuck 30 with the inspection object 20 placed thereon is elevated, the distal ends of the probes 11 come into contact with the inspection object 20, for example.

The electrode pads 131 of the electrode substrate 13 are electrically connected to the respective connection pads 133, which are provided on the upper surface of the electrode substrate 13, through respective electrode interconnections 132, which are provided within the electrode substrate 13. The connection pads 133 are electrically connected to an inspection apparatus, such as an IC tester (not illustrated). The inspection apparatus applies a predetermined voltage or current to the inspection object 20 through the probes 11. Signals outputted from the inspection object 20 are transmitted to the inspection apparatus through the probes 11 for inspection of the properties of the inspection object 20.

Figure 2:
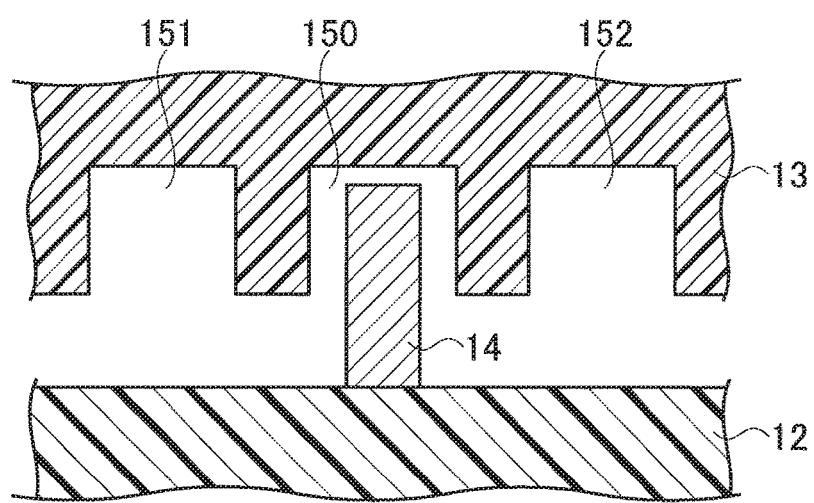
FIG. 2 is a schematic cross-sectional view illustrating the configuration of a guide pin and guide holes in the electric connection device according to the embodiment of the present invention.

The probe head 12 is provided with guide pins 14 for alignment of the probe head 12 and electrode substrate 13. The electrode substrate 13 includes a guide hole group composed of plural guide holes corresponding to each guide pin 14. In the electric connection device 10, each guide pin 14 corresponds to a guide hole group including a reference guide hole 150, which is located at a design reference position, and spare guide holes 151 and 152, which are located in the vicinity of the reference guide hole 150, as illustrated in FIG. 2. FIG. 2 illustrates a state where the guide pin 14 is fitted in the reference guide hole 150.

The design reference position at which the reference guide hole 150 is to be located is determined based on the position of the guide pin 14 determined when the electric connection device 10 is designed. Specifically, the design reference position is determined so that the probes 11 come into proper contact with the respective electrode pads 131 when the probe head 12 is attached to the electrode substrate 13 as designed with the guide pins 14 fitted in the reference guide holes 150. Herein, "the probes 11 come into proper contact with the respective electrode pads 131" means that the proximal end of each probe 11 is in contact with the center region of the corresponding electrode pad 131 and the electric contact resistance between the probe 11 and electrode pad 131 is low enough to enable precise measurement of the electric properties of the inspection object 20.

However, the positions of the guide pins 14 and reference guide holes 150 are sometimes different from the design positions thereof due to assembly error, processing error, deflection of materials, and the like caused during fabrication of the probe head 12 and electrode substrate 13. The positions of the guide pins 14 and reference guide holes 150 tend to differ from the design positions thereof, particularly due to an increase in size of the probe head 12 or reduction in pitch of the probes 11.

When the probe head 12 is attached to the electrode substrate 13 with the guide pins 14 fitted in the reference guide holes 150 but the positions of the guide pins 14 and reference guide holes 150 differ from the design positions thereof, the probes 11 and electrode pads 131 are misaligned. Furthermore, the probes 11 and electrode pads 131 can be sometimes misaligned when the probe head 12 is detached from the electrode substrate 13 for replacement or repair and is then attached again to the electrode substrate 13. In such cases, bad contact between the probes 11 and the electrode pads 131 prevents precise electric inspection of the inspection object 20.

In the electric connection device 10, when the guide pins 14 are fitted in the respective reference guide holes 150 but the probes 11 are not in proper contact with the electrode pads 131, each guide pin 14 is fitted to any one of the spare guide holes. The spare guide holes to be fitted to the respective guide pins 14 are selected so that the probes 11 come into proper contact with the respective electrode pads 131.

When the guide pins 14 are fitted in the reference guide holes 150 but the probes 11 are not in proper contact with the respective electrode pads 131, the probes 11 and electrode pads 131 come into proper contact by fitting each guide pin 14 to any one of the spare guide holes. The positions of the spare guide holes are determined so as to resolve misalignment of the probes 11 and electrode pads 131. Specifically, the relative positions of each reference guide hole 150 and the corresponding spare guide holes are determined considering the expected amounts of displacement of the reference guide hole 150 and the corresponding guide pin 14 from the design positions thereof.

The positions at which the spare guide holes are to be located are determined based on design error of the electric connection device 10 and past data of misalignment of the probes 11 and electrode pads 131 when the guide pins 14 are fitted in the reference guide holes 150, for example. The number of spare guide holes and the positions thereof can be arbitrarily determined in such a range that satisfies the aforementioned conditions.

Figure 3:
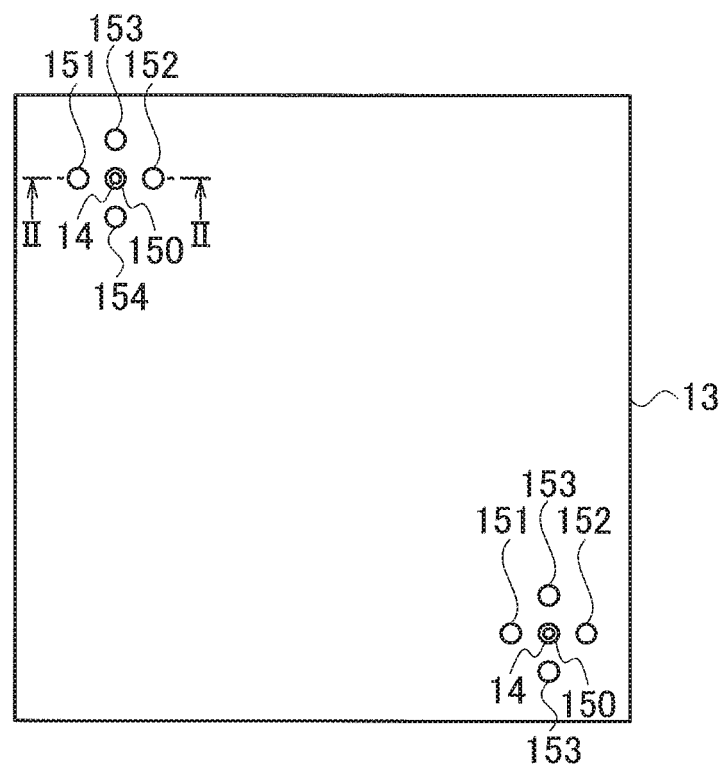
FIG. 3 is a schematic plan view illustrating a layout example of guide hole groups in the electric connection device according to the embodiment of the present invention.

As illustrated in FIG. 3, spare guide holes 151 to 154 are individually located around the reference guide hole 150 (above, below, and to the right and left of the reference guide hole 150 on the page), for example. FIG. 3 is a plan view of the surface of the electrode substrate 13 that faces the probe head 12. In FIG. 3, the guide pins 14 are fitted in the respective reference guide holes 150. FIG. 2 is a cross-sectional view taken along II-II direction of FIG. 3.

Figure 4:
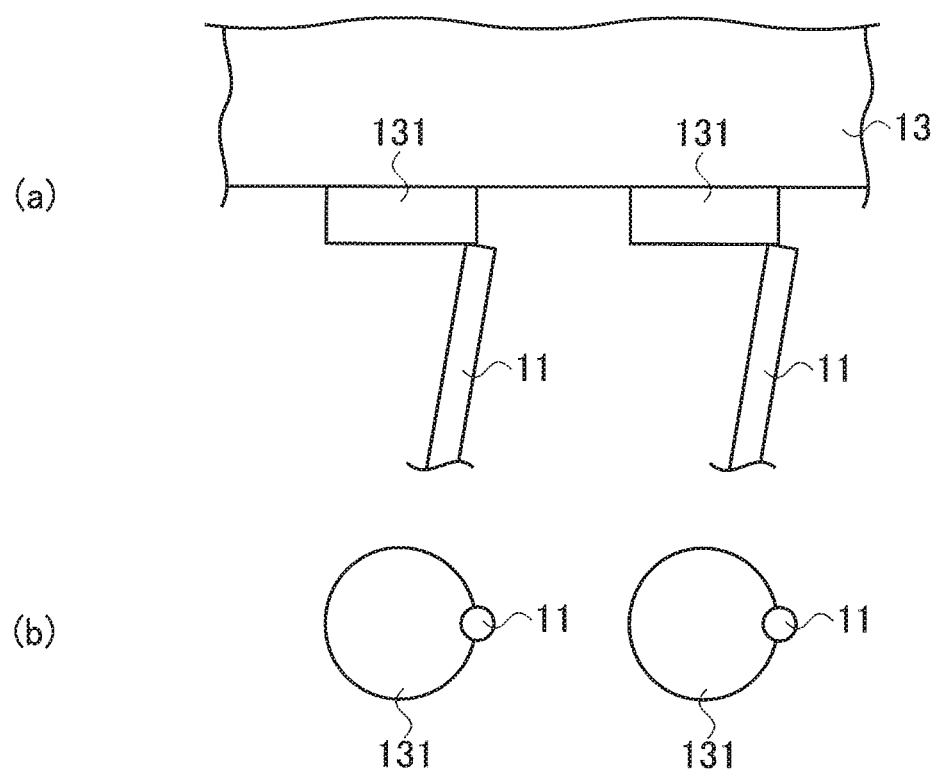
FIGS. 4(a) and 4(b) are schematic views illustrating an example of alignment of probes and electrode pads, FIG. 4(a) being a side view, FIG. 4(b) being a plan view as seen from the surface side of the electrode pads.

Consideration is given a case where the guide pins 14 are fitted in the reference guide holes 150 as illustrated in FIG. 3 but the proximal ends of the probes 11 and electrode pads 131 are not in proper contact as illustrated in FIGS. 4(a) and 4(b), for example. As illustrated in FIG. 4(b), the proximal end of each probe 11 is displaced to the right from the center of the corresponding electrode pad 131 (on the page).

Figure 5:
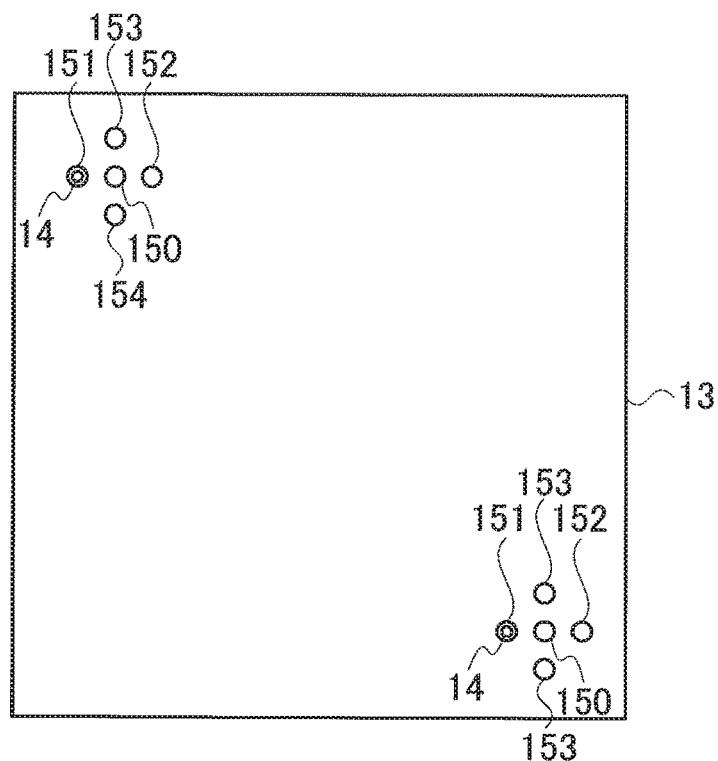
FIG. 5 is a schematic plan view illustrating another layout example of guide hole groups in the electric connection device according to the embodiment of the present invention.
Figure 6:
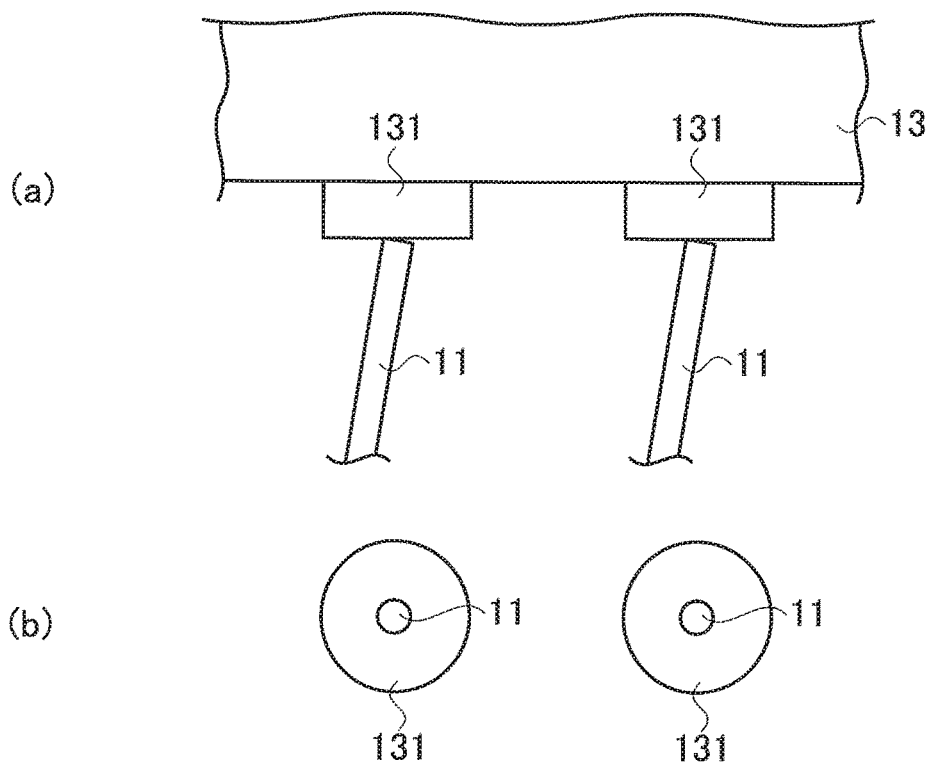
FIGS. 6(a) and 6(b) are schematic views illustrating an example of alignment of probes and electrode pads in FIG. 5, FIG. 6(a) being a side view, FIG. 6(b) being a plan view as seen from the surface side of the electrode pads.

In this case, as illustrated in FIG. 5, the guide pins 14 are fitted in the spare guide holes 151, that is located to the left of the corresponding reference guide hole 150 on the page. This allows the proximal ends of the probes 11 to come into contact with the centers of the respective electrode pads 131 as illustrated in FIGS. 6(a) and 6(b).

In the examples illustrated in FIGS. 3, 4(a), and 4(b), the guide hole groups each composed of the reference guide hole 150 and the spare guide holes around the same are located at corners on a diagonal of the electrode substrate 13 across the center thereof. The regions where the guide hole groups are located are not limited to the aforementioned two places. The guide hole groups may be located at four respective corners, for example. Preparing plural guide hole groups and plural guide pins 14 corresponding thereto in such a manner enables more precise alignment of the probe head 12 and electrode substrate 13.

As described above, the electric connection device 10 according to the embodiment of the present invention is equipped with a guide hole group, that is composed of the reference guide hole 150 and spare guide holes provided around the same. The guide holes to be fitted to the guide pins 14 can be selected from the spare guide holes in addition to the reference guide holes 150 so that the probes 11 can come into proper contact with the respective electrode pads 131 of the electrode substrate 13. According to the electric connection device 10 illustrated in FIG. 1, it is possible to easily resolve misalignment of the probes 11 and electrode pads 131.

When the guide pins 14 are fitted in the guide holes 150, the proximal ends of the probes 11 are displaced by about 10 to 20 μm from the centers of the respective electrode pads 131 with outer diameters of 30 to 40 μm, for example. In such a case, spare guide holes are prepared at distances of 10 to 20 μm from each reference guide hole 150 so that the guide pins 14 are fitted in corresponding spare guide holes. This allows the proximal ends of the probes 11 to come into contact with the center regions of the respective electrode pads 131.

As measurement is repeated, misalignment of the probes 11 and electrode pads 131 increases in many cases compared with the state where the probe head 12 is attached to the electrode substrate 13 for the first time. The contact resistance between the probes 11 and electrode pads 131 is thereby increased, thus resulting in imprecise measurement of the electric properties of the inspection object 20. In the state where the probe head 12 is attached to the electrode substrate 13 for the first time in particular, it is preferred that the proximal ends of the probes 11 are in contact with the center regions of the respective electrode pads 131. This enables electric measurement of the inspection object 20 with high degree of accuracy even after the measurement is repeated.

The guide holes to be fitted to the guide pins 14 can be selected by various methods. For example, the guide pins 14 are fitted in the reference guide holes 150 at first. If the probes 11 and electrode pads 131 are misaligned, the direction and distance of the misalignment are checked. The spare guide hole to be fitted to each guide pin 14 is properly selected based on the conditions of the misalignment.

Modification

Figure 7:
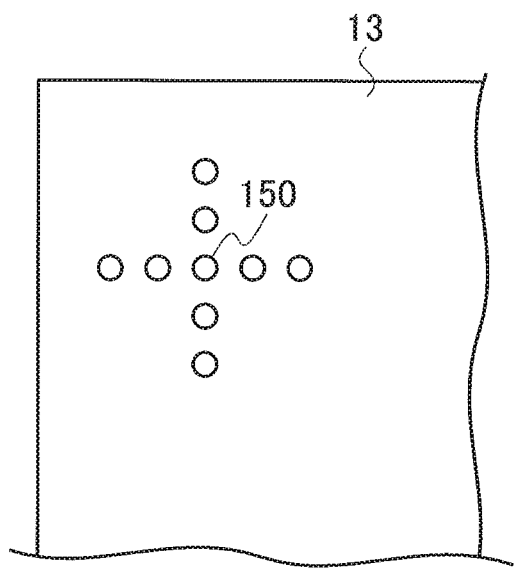
FIG. 7 is a schematic plan view illustrating a layout example of a guide hole group in the electric connection device according to a modification of the embodiment of the present invention.

FIG. 3 illustrates the configuration where the spare guide holes are individually located above, below, and to the right and left of each reference guide hole 150 by way of example. However, the numbers of spare guide holes located above, below, and to the right and left of each reference guide hole are not limited to one and may be more than one. FIG. 7 illustrates an example in which two spare guide holes are located at each side above, below, and to the right and left of the reference guide hole 150. In FIG. 7, reference numerals of the spare guide holes are not illustrated. The spare guide holes may be arranged in a radial fashion or may include one spare guide hole.

Figure 8:
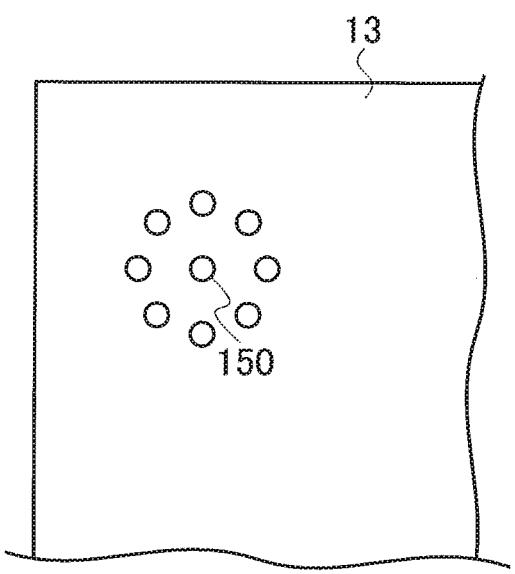
FIG. 8 is a schematic plan view illustrating another arrangement example of a guide hole group in the electric connection device according to the modification of the embodiment of the present invention. A more complete understanding of the subject matter may be derived by referring to the detailed description and claims when considered in conjunction with the following figures, wherein like reference numbers refer to similar elements throughout the figures.

Alternatively, as illustrated in FIG. 8, the spare guide holes (reference numerals thereof are not illustrated) may be arranged concentrically around the reference guide hole 150. The spare guide holes may be arranged around the reference guide hole 150 in multiple layers.

As described above, the positions of the spare guide holes can be arbitrarily determined according to the expected direction of misalignment of the probes 11 and electrode pads 131. The spare guide holes may be intensively located only in a particular direction from the reference guide hole 150, for example.

OTHER EMBODIMENTS

The present invention is described with the embodiment above. However, it should not be understood that the present invention is limited by the description and drawings constituting a part of the disclosure. Based on the disclosure, those skilled in the art will appreciate various substitutions, examples, and operation techniques.

In the aforementioned example, the guide pins 14 are provided for the probe head 12 while the guide holes are provided for the electrode substrate 13. However, the guide pins 14 may be provided for the electrode substrate 13 while the guide holes are provided for the probe head 12.

It is certain that the present invention includes various embodiments not described herein in such a manner.

INDUSTRIAL APPLICABILITY

The electric connection device of the embodiment is applicable to fields of measurement of properties of objects.

What is claimed is:

1. An electric connection device, comprising:
a probe;
a probe head that holds the probe; and
an electrode substrate on which an electrode pad to be connected to a proximal end of the probe is provided, wherein
the probe head is provided with a plurality of guide pins for alignment of the probe head and the electrode substrate,
the electrode substrate is provided with a guide hole group composed of a plurality of guide holes corresponding to the guide pin, the guide hole group corresponding to each of the guide pins, and
the guide hole group is composed of a reference guide hole located at a design reference position and a spare guide hole located in the vicinity of the reference guide hole.

2. The electric connection device according to claim 1, wherein
relative positions of the reference guide hole and the spare guide hole are determined so that the proximal end of the probe is in proper contact with the electrode pad of the electrode substrate when each of the guide pins is fitted in at least any guide hole in the corresponding guide hole group.

3. The electric connection device according to claim 1, wherein a plurality of the spare guide holes are located around the reference guide hole.

4. The electric connection device according to claim 1, wherein
the reference position is determined based on a design position of each guide pin, and
relative positions of the reference guide hole and the spare guide hole are determined considering expected amounts of displacement of the reference guide hole and the corresponding guide pin from the design positions thereof.

* * * * *